United States Patent [19]

Elsaesser et al.

[11] Patent Number: 5,753,404
[45] Date of Patent: May 19, 1998

[54] PHOTOSENSITIVE RECORDING MATERIAL CONTAINING NEGATIVE WORKING DIAZONIUM SALT LAYER AND DISCONTINUOUS TOP LAYER

[75] Inventors: Andreas Elsaesser; Otfried Gaschler; Werner Frass, all of Wiesbaden; Klaus-Peter Konrad, Ingelheim, all of Germany

[73] Assignee: Agfa-Gevaert AG, Leverkusen, Germany

[21] Appl. No.: 558,580

[22] Filed: Oct. 31, 1995

[30] Foreign Application Priority Data

Nov. 3, 1994 [DE] Germany ............... 44 39 184.6

[51] Int. Cl.$^6$ ............... G03F 7/021; G03F 7/11
[52] U.S. Cl. ............... 430/162; 430/168; 430/169; 430/300; 430/325
[58] Field of Search ............... 430/162, 168, 430/169, 300, 325

[56] References Cited

U.S. PATENT DOCUMENTS

| | | | |
|---|---|---|---|
| 4,216,289 | 8/1980 | Oda et al. | 430/162 |
| 4,288,526 | 9/1981 | Oda et al. | 430/162 |
| 4,842,982 | 6/1989 | Seibel et al. | 430/156 |
| 5,162,193 | 11/1992 | Murray et al. | 430/162 |

FOREIGN PATENT DOCUMENTS

| | | |
|---|---|---|
| 1148014 | 6/1983 | Canada. |
| 1542131 | 3/1979 | United Kingdom. |
| 2 046 461 | 11/1980 | United Kingdom. |
| 2 075 702 | 11/1981 | United Kingdom. |
| 2 081 919 | 2/1982 | United Kingdom. |

*Primary Examiner*—Christopher G. Young
*Attorney, Agent, or Firm*—Foley & Lardner

[57] ABSTRACT

A photosensitive recording material is described which has a layer base, a negative-working photosensitive layer containing a diazonium salt and a water-insoluble polymeric binder which is soluble or swellable in aqueous alkaline solutions, and a discontinuous top layer which forms a rough surface and which is composed of particles of a water-insoluble polymer which is dispersible in water in the presence of anionic or anionic/nonionic dispersants and which has a content of free acid groups or acid groups neutralized by salt formation of less than 0.8 mmol/g, the mean height of the particles being 2 to 6 μm, the maximum height less than 10 μm, the mean horizontal diameter less than 40 μm, the maximum diameter less than 80 μm and the number of particles being 100 to 10,000 per cm$^2$. The material is suitable for the production of planographic printing plates and requires only short vacuum times in a vacuum-operated copying frame. The material can be developed without residue after exposure, the rough surface remaining intact at the image areas.

20 Claims, No Drawings

PHOTOSENSITIVE RECORDING MATERIAL CONTAINING NEGATIVE WORKING DIAZONIUM SALT LAYER AND DISCONTINUOUS TOP LAYER

DESCRIPTION

The invention relates to a recording material, in particular for the production of planographic printing plates, having a layer base, a photosensitive layer containing a diazonium salt and a water-insoluble, organic, polymeric binder which is soluble in aqueous alkali solutions, and a discontinuous top layer situated thereon and forming a rough surface.

Conventionally, the first step in the production of planographic printing plates is the imagewise exposure of the photosensitive recording material in a vacuum-operated contact copying frame. In this step, the master should be brought as rapidly as possible into intimate contact with the recording material. After the evacuation, no air inclusions should remain between master and recording material. The nitrogen liberated from the diazonium salt during the exposure should also be removed as rapidly as possible so that no nitrogen inclusions form. Both requirements can be fulfilled with a recording material whose photosensitive layer is superficially roughened. A rough surface can be achieved, for example, by covering with dust before the imagewise irradiation. However, such a method generally produces unevenly roughened surfaces, with the result that uneven copying results are also achieved.

The producers of the photosensitive copying materials have therefore endeavored to provide their products with a surface which is already rough in a defined way. In doing this, various methods have been used. Thus, the base material can be coated with a photosensitive solution in which water-soluble particles which are washed out with water after drying the layer are suspended. The surface of the photosensitive layer then has a multiplicity of depressions.

A rough surface can also be achieved by applying continuous or discontinuous matting layers. Thus, DE-A 30 09 928 (=GB-A 2 046 461) describes a method in which a photosensitive layer is coated with a non-photosensitive coating liquid containing, in dispersed form, particles of polyethylene, polypropylene, ethylene/propylene copolymers, ethylene/vinyl acetate copolymers, polyethylene terephthalate or a crosslinked vinyl polymer. After drying, the individual particles are left behind as very small projections in the continuous top layer.

Continuous or discontinuous top layers having defined surface roughness can be applied with the aid of an embossing roller. The coating solutions used for this purpose may contain conventional matting agents, such as silicon dioxide, zinc oxide, titanium dioxide, glass beads, aluminum oxide, starch, poly(methylene methacrylate), polystyrene or phenolic resins (DE-A 26 06 793=GB-A 1 542 131).

DE-A 31 31 570 (=GB-A 2 081 919) discloses a recording material having a photosensitive layer and a matting layer situated thereon. The matting layer is applied by spraying-on and drying an aqueous solution or dispersion containing an organic copolymer. The spraying-on can also be carried out electrostatically. The photosensitive layer may contain 1,2-naphthoquinone 2-diazide and a polymeric binder. As Example 1 shows, the matting layers must be removable during development. A matting layer containing copolymers which has a content of polymer units containing salt groups of 12% by weight or more fulfills this condition. If, however, a copolymer containing only 4% by weight of Na acrylate units is used, the matting is no longer removed completely and, as a consequence, discolorations (spot formation) occur during printing.

DE-A 34 33 247 (=U.S. Pat. No. 4,842,982) describes a photosensitive or radiation-sensitive recording material in which a rough top layer is sprayed onto the radiation-sensitive layer and dried. Both layers have essentially the same composition. If the recording material is exposed only briefly, as may be necessary for fine-screen work, the residues of the layer are often still left behind in the non-image regions after development. These then have to be removed in an additional correction step.

A further possibility for producing a matted photosensitive recording material is to introduce finely divided particles into the photosensitive layer whose smallest dimension is at least as great as the thickness of the layer. The particles may be of an inorganic or organic nature (DE-A 29 26 236=CA-A 1 148 014). Thermally cured phenolic resins are described as particularly suitable (DE-A 31 17 702= GB-A 2 075 702).

A recording material in which the photosensitive layer is itself matted offers the advantage that the matting remains intact at the image areas after imagewise exposure and subsequent development. The separate matting layers described are, however, soluble or dispersible in the developer and are removed virtually completely. However, aureole formation may occur in the photosensitive layer around the matting particles. The matting particles may also form agglomerates.

The object was consequently to provide a matted, photosensitive recording material which does not have the disadvantages of the known materials. In particular, it should be developable without residue in the non-image areas. On the other hand, the matting should remain intact at the image areas.

The present application consequently relates to a recording material having a layer base, a photosensitive layer containing a diazonium salt and a water-insoluble organic polymeric binder which is soluble or swellable in aqueous alkaline solutions, and a discontinuous top layer which forms a rough surface.

The material according to the invention is one wherein the top layer is composed of a water-insoluble polymer which is dispersible in water in the presence of anionic or anionic/nonionic dispersants and which has a content of free acid groups or acid groups neutralized by salt formation of less than 0.8 mmol/g, the mean height of the particles being 2 to 6 µm, the maximum height being less than 10 µm, the mean horizontal diameter being less than 40 µm and the maximum diameter being less than 80 µm and the number of particles being 100 to 10,000 per cm$^2$.

Particularly suitable polymers for the top layer are those containing sulfo, carboxy and/or phosphono groups either in free form or as a salt formed with a monovalent or polyvalent cation. It is essential that the content of acid groups and/or salt groups is not more than 0.8 mmol/g. If it is higher, the matting is also removed at the image points during development. With a content of acid groups and/or salt groups in the polymer of less than 0.01 mmol/g, an anionic stabilizer is absolutely necessary since oleophilic layer residues are otherwise left behind in the non-image areas and, during printing, these take up ink and form so-called "spots".

Polymers having a content of acid groups and/or salt groups of 0.03 to 0.75 mmol/g are preferred. An at least partial neutralization of the acid groups is also generally preferred in the case of these polymers.

The cations in the salts mentioned are, in particular, Na$^+$, K$^+$, NH$_4^+$, Ca$^{2+}$, Zn$^{2+}$ or Al$^{3+}$. The polymers are usually polycondensation compounds or polyaddition compounds. Suitable polymers are, for example, polyesters, polyamides, polyurethanes or polyureas which contain the molar amounts mentioned of acid groups and/or salt groups. In these cases, the acid groups or salt groups are, as a rule, bound to the diol or diamine units in said polymers.

Also suitable are copolymers containing a) units of acrylic acid, methacrylic acid, itaconic acid, maleic acid, ethylenesulfonic acid (=vinylsulfonic acid), styrenesulfonic acid, 2-acryloylamino-1,1-dimethylethanesulfonic acid, vinylphosphonic acid and/or 2-acryloylamino-1,1-dimethylethylphosphonic acid (=acrylamidoisobutylphosphonic acid) and also their salts, and b) units of acrylic acid esters, methacrylic acid esters, acrylamides; methacrylamides, styrene, vinylesters and/or vinylethers. The units (a) may also originate from phosphinic acids, such as methylvinylphosphinic acid. The molar amount of the units (a) containing acid groups or salt groups are also chosen in the polyaddition compounds so that the polymers contain up to 0.80 mmol, preferably 0.01 to 0.75 mmol, of said groups per gram. The acid groups or salt groups are preferably carboxy, carboxylate, sulfo, sulfonate, phosphono or phosphonate groups.

In a particular embodiment, polymers can also be used which contain no acid groups or salt groups or less than the abovementioned minimum amount of acid groups or salt groups. However, the aqueous dispersions must then be stabilized with anionic surfactant compounds. These compounds preferably contain anions of the formula

in which
R$^1$ is a (C$_6$–C$_{20}$)alkyl radical or an optionally (C$_1$–C$_{18}$)alkyl-substituted (C$_6$–C$_{12}$)aryl radical,
R$^2$ is a hydrogen atom or a methyl group,
Y is an SO$_3^-$, CH$_2$—CO$_2^-$ or PO$_3^{2-}$ group and
n is an integer from 0 to 50
and the associated cation is a sodium, potassium, ammonium, diethanolammonium or triethanolammonium ion.

The anionic surfactants may also be used together with the abovementioned polymers containing 0.01 to 0.80 mmol/g of acid groups and/or salt groups. The proportion of the anionic surfactants is 1 to 20% by weight, based in each case on the total weight of the nonvolatile constituents of the dispersion, i.e., the constituents of the solid coating which remain on the surface of the photosensitive layer after drying.

The sprayable dispersion may additionally also contain nonionic surfactive compounds and/or water-soluble protective colloids. Suitable nonionic surfactive compounds are, for example, compounds of the formula in which Y is a hydrogen atom. R$^1$ may be a hydrogen atom or a (C$_1$–C$_5$) alkyl group in addition to the abovementioned radicals and n is an integer of at least 7.

The proportion of nonionic surfactive compounds is up to 10% by weight, based on the total weight of the nonvolatile constituents of the dispersion. Suitable as protective colloids are, in particular, homopolymers or copolymers of vinyl alcohol, cellulose derivatives, such as methylcellulose, hydroxyethylcellulose and carboxymethylcellulose, starch and starch derivatives, gum arabic, casein, gelatin and polyglycols. The proportion of colloids should not be more than 30% by weight, based on the total weight of the nonvolatile constituents of the dispersion. If the proportion is above the specified percentage, a detachment of the matting particles may occur in the image areas during development.

The recording material according to the invention can be produced by spraying onto the photosensitive layer the abovementioned aqueous dispersion, which preferably has a proportion of nonvolatile constituents of 5 to 50% by weight. The spraying-on is carried out by procedures which are known per se, such as pressurized liquid atomization, for which purpose a single-substance nozzle is generally used, pressurized air atomization (two-substance nozzle), ultrasonic atomization, electrostatic spraying or by spraying with the aid of a spray bell, the so-called "high-speed rotation bell", which rotates at a high speed (approximately 20,000 revolutions per minute). An electrical voltage can additionally be applied between spray bell and the substrate to be matted.

The subsequent drying is carried out at temperatures of up to 140° C., preferably with the aid of infrared radiators or a convection dryer.

Matting particles applied in this way frequently lie on the radiation-sensitive layer in the form of more or less flattened hemispheres or hemiellipsoids. Because of their shape, the matting particles are also referred to as "domes".

After an evacuation time in the vacuum-operated contact copying frame of 10 to 60 s, master and recording material lie evenly on top of one another. If a recording material having domes with a height of more than 10 µm is used, on the other hand, an impaired reproduction of fine drawings is observed. If the domes have a diameter of more than 80 µm, their residues may still be left behind in the non-image areas after imagewise irradiation and development. Domes having a diameter in the layer plane of less than 40 µm, very particularly of less than 20 µm, have proved advantageous.

The number of domes per square centimeter is preferably 500 to 5000. With less than 100 domes/cm$^2$, large-area screens are frequently transferred unevenly. A number of domes exceeding 10,000/cm$^2$ is not disadvantageous, but it does not result in any further improvement either.

The photosensitive layer contains diazonium salts, preferably diazonium salt polycondensation products, as photosensitive compounds. Suitable as such compounds are condensation products of condensable aromatic diazonium salts, for example of diphenylamine-4-diazonium salts, with aldehydes, preferably formaldehyde. Particularly advantageously, co-condensation products are used which contain, in addition to the diazonium salt units, yet other, nonphotosensitive units derived from condensable compounds, in particular aromatic amines, phenols, phenolethers, aromatic thioethers, aromatic hydrocarbons, aromatic heterocycles and organic acid amides. These condensation products are described in DE-A 20 24 244 (=U.S. Pat. No. 3,867,147). Generally, all the diazonium salt polycondensation products which are described in DE-A 27 39 774 are suitable.

The diazonium salt units A—N$_2$X are preferably derived from compounds of the formula (R$^3$-R$^4$-)$_p$R$^5$-N$_2$X, in which
X is the anion of the diazonium compound,
p is an integer from 1 to 3,
R$^3$ is an aromatic radical containing at least one position capable of condensation with an active carbonyl compound, $R^5$ is a (p+1)valent benzene radical,
$R^4$ is a single bond or one of the groups:

—$(CH_2)_q$—$NR^6$—,
—O—$(CH_2)_r$—$NR^6$—,
—S—$(CH_2)_r$—$NR^6$—,
—S—$CH_2$—CO—$NR^6$—,
—O—$R^7$—O—,
—O—
—S— or
—CO—$NR^6$— in which q is an integer from 0 to 5, r is an integer from 2 to 5, $R^6$ is hydrogen, an alkyl group containing 1 to 5 carbon atoms, an aralkyl group containing 7 to 12 carbon atoms or an aryl group containing 6 to 12 carbon atoms, and $R^7$ is an arylene group containing 6 to 12 carbon atoms.

P is preferably 1, thus R5 is preferably a phenylene group.

Furthermore, the diazonium salt units may be present as side groups of polymers, as described, for example, in U.S. Pat. No. 4,581,313.

The recording materials according to the invention furthermore contain a polymeric, water-insoluble binder which is soluble or dispersible in aqueous alkali solutions. The proportion of diazonium compound in the photosensitive layer is generally 5 to 90, preferably 10 to 70% by weight, the proportion of polymeric binder is 10 to 95, preferably 30 to 90% by weight, based on the total nonvolatile layer constituents, i.e., the constituents of the solid photosensitive coating obtained after evaporation of the solvent.

Examples of polymeric binders are polyvinyl ester copolymers, polyvinylacetals and acrylate or methacrylate polymers containing aromatic or aliphatic hydroxyl, carboxylic acid, sulfonic acid, phosphonic acid, acid amide or acid imide units. Furthermore, polycondensates containing suitable functional units such as phenolic resins, polyurethanes or epoxy resins are suitable.

Particularly preferred binders are reaction products of an intramolecular anhydride of an organic polycarboxylic acid with a synthetic polymer containing hydroxyl groups but no further functional groups capable of reacting with acid anhydrides.

The acid anhydride is preferably derived from a dicarboxylic acid or tricarboxylic acid, in particular a dicarboxylic acid, and may contain one, two or more rings.

The reaction products with maleic anhydride, phthalic anhydride, succinic anhydride and 3-oxaglutaric anhydride are preferred.

Suitable synthetic polymers containing hydroxyl groups are, in particular, polymers containing vinyl alcohol units, and also epoxy resins and hydrolyzed epoxy resins, copolymers of allyl alcohol or higher unsaturated alcohols, polyhydroxyalkyl acrylates and polyhydroxyalkyl methacrylates, and similar polymers.

Suitable polymers with vinyl alcohol units are partially hydrolyzed polyvinyl esters, polyvinylacetals containing free hydroxy groups or corresponding reaction products of copolymers, or copolymers containing vinyl ester units or vinyl acetal units or vinyl alcohol units.

The molecular weight of the binders containing carboxyl groups is generally between 5000 and about 200,000, preferably between 10,000 and 100,000. The acid value of the binders may generally be between 5 and 300, preferably between 10 and 200. These preferred binders are described in greater detail in EP-A 152 819.

To stabilize the solution or the layer obtained therewith, it is advantageous to add a compound with an acid nature to it. Mineral acids and strong organic acids, of which phosphoric acid, sulfuric acid, perchloric acid, boric acid or p-toluenesulfonic acid are preferred, are suitable. A particularly well suited acid is phosphoric acid.

Plasticizers, adhesion promoters, dyes, pigments and ink formers may furthermore be added to the solutions.

In order to render the exposed regions visible, the layer may also contain small amounts of indicator dyes and compounds which form acid when exposed to actinic radiation. The acid then effects a color change in an indicator dye. Suitable acid formers are, for example, 1,2-naphthoquinone 2-diazide-4-sulfonyl chloride, chromophore-substituted halomethyl-s-triazines and also diazonium salts, in particular diazonium tetrafluoroborates and diazonium hexafluorophosphates. Suitable indicator dyes are, for example, cationic triarylmethane or methine dyes.

If a base material is to be coated with the photosensitive mixture, a solution of the mixture is generally applied. The solvent should be matched to the planned coating method, the layer thickness and the drying conditions. Suitable as solvents are ketones, such as butanone, chlorinated hydrocarbons (such as trichloroethylene and 1,1,1-trichloroethane), alcohols (such as n-propanol), ethers (such as tetrahydrofuran), glycol monoethers (such as ethylene glycol monoalkyl ethers and propylene glycol monoalkyl ethers) and esters (such as butyl acetate and propylene glycol monoalkyl ether acetate). Mixtures of various solvents may also be used. In specific cases, it may be advantageous to use yet further solvents, such as acetonitrile, dioxane, dimethylacetamide or dimethyl sulfoxide, in addition. In principle, all those solvents are suitable which do not react irreversibly with the constituents of the mixture. Glycol monoalkyl ethers, in particular ethylene glycol monomethyl ether and propylene glycol monomethyl ether, are particularly preferred.

The base materials are usually composed of metal. Photosensitive recording materials for the production of offset printing plates have, as a rule, bright-rolled, mechanically and/or electromechanically grained and optionally anodized aluminum as base material. The aluminum may also be pretreated chemically in addition, for example with polyvinylphosphonic acid, silicates, phosphates, hexafluorozirconates or with hydrolyzed tetraethyl orthosilicate.

The coating itself is carried out in a manner known per se by spin-coating, spraying, immersion or by application with rollers, slot dies, doctor blades or casting appliances.

To produce a printing form, the radiation-sensitive recording material is imagewise irradiated in a vacuum-operated contact copying frame under a film master and then developed with an aqueous alkaline developer. Tubular lamps, xenon pulsed lamps, mercury vapor lamps doped with metal halides or carbon-arc lamps are suitable for the irradiation. In addition to alkali-metal silicates, the aqueous alkaline developer may also contain small amounts of buffer substances, solvents, surfactants, reducing agents, defoaming agents, complexing agents, corrosion inhibitors and/or hydrotropes. In addition, it may also contain carboxylic, sulfonic and/or phosphonic acids. The normality of the alkali-metal silicate developer is preferably 0.2 to 1.0 gram equivalents/l. After the development, the printing form may also be gummed.

The invention is explained in greater detail with reference to the following Examples. Comparison Examples are characterized by a *. pbw denotes "parts by weight". Percentages and quantitative ratios are in units of weight. All the other abbreviations are listed below.

1. Characteristic quantities of the dispersion

FK solids content of the dispersion (in % by weight)

SG acid group and/or salt group content (mmol/g of resin)

TG glass transition temperature (° C.)

2. Characteristic quantities of layer topography

D mean dome diameter (μm)

Dm maximum dome diameter (μm)

H mean dome height (μm)

Hm maximum dome height (μm)

n number of domes per cm$^2$

3. Test criteria

T evacuation time in seconds for film master/planographic printing plate contacting K domes in image areas after development:
 +=present
 0=partially present
 −=detached S spots in non-image areas after development:
 +=no spots
 −=spots present A breaks in full-tone image areas due to incomplete curing
 +=no breaks
 −=breaks observable R screen regularity; the evenness of the reproduction of a large-area 60 cm screen with 20% area coverage is rated visually as follows:
 +=no breaks,
 0=occasional breaks, slight screen irregularity,
 −=many breaks, severe screen irregularity, V storage behavior of the photosensitive materials in contact with interleaving paper under the following conditions:

| | |
|---|---|
| temperature: | 40° C. |
| relative atmospheric humidity: | 90% |
| pressure loading: | 0.25 bar |
| duration: | 72 hours |

0=sticks to interleaving paper
−=strong sticking or transfer of paper fibers to domes
+=does not stick

EXAMPLE 1

A 0.3 mm thick aluminum foil grained electrolytically ($R_z$ value according to DIN 4768: 5.0 μm) in hydrochloric acid was subjected to intermediate pickling with sulfuric acid and anodized in sulfuric acid (oxide weight 3.0 g/m$^2$), hydrophilized with polyvinylphosphonic acid and then coated with the following solution:

1.7 pbw of the reaction product of a polyvinylbutyral having a molecular weight of 70,000 to 80,000 and containing 71% by weight of vinylbutyral units, 2% by weight of vinyl acetate units and 27% by weight of vinyl alcohol units, with propenylsulfonyl isocyanate, 0.6 pbw of a diazonium salt polycondensation product composed of 1 mol of 3-methoxydiphenylamine-4-diazonium sulfonate and 1 mol of 4,4'-bismethoxymethyl diphenyl ether, precipitated as mesitylenesulfonate, 0.09 pbw of victoria pure blue FGA (C. I. Basic Blue 81) and 0.07 pbw of phosphoric acid (85%-strength) in 60 pbw of 2-methoxyethanol and 20 pbw of butyl acetate.

The layer was dried for 1 minute at 125° C. The layer weight was 1.0 g/m$^2$.

The aqueous dispersion of a methacrylic acid/methyl methacrylate/ethyl acrylate copolymer whose pH had been adjusted to 10 with NaOH was then sprayed on with the aid of a high-speed rotation bell with electrostatic assistance.

Characteristic data of dispersion

FK=20, anionic stabilizer in accordance with the formula in which $R^1=C_9H_{19}$-phenyl, $R^2=H$, n=8 and $Y=SO_3^-$. Cation: $Na^+$. The proportion of methacrylic acid varied as described in Table 1, with a constant proportion of ethyl acrylate.

TABLE 1

| Example No. | SG | in % by wt. methacrylic acid | $T_g$ |
|---|---|---|---|
| 1-1 | 0.18 | 1.5 | ≧75° C. |
| 1-2 | 0.36 | 3.0 | ≧75° C. |
| 1-3 | 0.53 | 4.6 | ≧75° C. |
| 1-4 | 0.71 | 6.1 | ≧75° C. |
| 1-5* | 1.43 | 12.2 | ≧75° C. |
| 1-6* | 2.32 | 19.9 | ≧75° C. |

In two further Comparison Examples, a discontinuous top layer was produced in one case analogously to EP-A 174 588 by spraying-on and drying the coating solution used to produce the photosensitive layer (1-7*) and no top layer was applied in a second case (1-8*).

Spraying conditions

| | |
|---|---|
| Distance from spraying bell to substrate: | 15 cm |
| Bell speed: | 20,000 rpm |
| Bell diameter: | 6 cm |
| Potential difference: | 40 kV |
| Infrared drying | |

The following values were found for the dome coverage from the image analysis

D=30–35 μm, Dm=60–70, H=3–4, Hm=7–9 and n=2000 to 3000.

The plates were exposed for freedom from film edge in a vacuum-operated contact copying frame using a 5 kW metal-halide mercury-vapor lamp at a distance of 110 cm for 90 s. Development was carried out in an immersion-bath development unit using a brush at a processing rate of 0.8 m/min using a developer solution having the following composition:

4 pbw of sodium pelargonate, 1 pbw of the sodium salt of ethylene diaminetetramethylenephosphonic acid, 1 pbw of phenoxyethanol and 2 pbw of potassium silicate in 93 pbw of water The results shown in Table 1a were obtained.

TABLE 1a

| Example | T | K | S | R | A | V |
|---|---|---|---|---|---|---|
| 1-1 to 1-4 | <20 | + | + | + | + | + |
| 1-5* | <20 | 0 | + | + | + | 0 |
| 1-6* | <20 | − | + | + | + | − |
| 1-7* | <20 | + | + | + | − | ± |
| 1-8* | >30 | omitted | omitted | − | omitted | omitted |

The results show that a noncritical behavior in the sidelighting tests exists after a development step only in the case of the materials according to the invention.

EXAMPLE 2

A 0.3 mm thick aluminum foil electrolytically grained ($R_z$ value according to DIN 4768:3.2 µm) in hydrochloric acid was subjected to an intermediate pickling with sulfuric acid and anodized in sulfuric acid (oxide weight 2.0 g/m²), hydrophilized with polyvinylphosphonic acid and then coated with the following solution:

- 1.2 pbw of the reaction product of the polyvinylbutyral specified in Example 1 with maleic anhydride (acid value 30),
- 1.2 pbw of a diazonium salt polycondensation product of 3-methoxydiphenylamine-4-diazonium sulfonate and formaldehyde,
- 0.02 pbw of phenylazodiphenylamine and
- 0.3 pbw of Renol blue B2G.-H (C. I. 74 160) in
- 97.3 pbw of 2-methoxyethanol The coating was dried for 1 minute at 125° C. The layer weight was 1.1 g/m².

The aqueous dispersion of a methacrylic acid/styrene/ethyl acrylate copolymer which had a methacrylic acid content of 0.46 mmol/g corresponding to 4% by weight of methacrylic acid and which was adjusted to a pH of 9.5 with a KOH/NaOH mixture was then sprayed on using a high-speed rotation bell with electrostatic assistance.

Characteristic dispersion data

Tg approximately 70° C., FK varied in accordance with Table 2a, anionic stabilizer as in Example 1. Cation: Na*. Protective colloid: 10% by weight of polyvinyl alcohol (®Mowiol 3-83 supplied by Hoechst AG) based on FK.

Spraying conditions

| | |
|---|---|
| Distance from spraying bell to substrate: | 15 cm |
| Bell speed: | 25,000 rpm |
| Bell diameter: | 6 cm |
| Potential difference: | 35 kV |
| Combined convection/IR drying | |

This resulted in the dome coverage shown in Table 2a.

TABLE 2a

| Example | FK | D | DM | H | Hm | n |
|---|---|---|---|---|---|---|
| 2-1 | 30 | <40 | <80 | 6 | <10 | approx. 2000 |
| 2-2 | 25 | <40 | <80 | 5 | <10 | approx. 2000 |
| 2-3 | 20 | <40 | <80 | 4 | <10 | approx. 2000 |
| 2-4 | 15 | <40 | <80 | 3 | <10 | approx. 2000 |
| 2-5* | 10 | <40 | >80 | 2 | <10 | approx. 2000 |
| 2-6* | 5 | <40 | >80 | 1 | <10 | approx. 2000 |

A continuous matting layer in accordance with DE-A 25 12 043 from a 4%-strength aqueous solution of polyvinyl alcohol (K-value 4; 12% residual acetyl groups) which contained 5% by weight, based on solids, of silica gel having a mean particle size of 5 µm was applied to the photosensitive layer as Comparison Example 2-7*.

A test master was placed on a plate and exposed in a vacuum-operated contact copying frame using a 5 kW metal-halide mercury-vapor lamp at a distance of 110 cm for 60 s. The plate was then developed in an immersion bath development unit using a brush at a processing rate of 0.6 m/min in a developer solution of the following composition:

- 1 pbw of 1-amino-2-propanol,
- 0.2 pbw of $Na_2SiO_3 \cdot 5H_2O$,
- 2 pbw of sodium cumenesulfonate and
- 0.1 pbw of nonylphenol/ethylene oxide reaction product containing 15 ethylene oxide units per mol in
- 96.7 pbw of water.

The results reproduced in Table 2b show the good behavior of the recording materials according to the invention.

TABLE 2b

| Example | T | K | S | A | V |
|---|---|---|---|---|---|
| 2-1 to 2-4 | <20 | + | + | + | + |
| 2-5* | <20 | + | 0 | + | + |
| 2-6* | 23 | + | − | + | + |
| 2-7* | <20 | − | + | + | − |

EXAMPLE 3

An aluminum foil in accordance with Example 1 was coated with the following solution:

- 2.1 pbw of the reaction product of the polyvinylbutyral specified in Example 1 with trimellitic anhydride (acid value 90),
- 0.6 pbw of the diazonium salt polycondensation product specified in Example 1,
- 0.06 pbw of phosphoric acid (85%-strength) and
- 0.3 pbw of copper phthalocyanine in
- 96.9 pbw of 2-methoxyethanol.

The coating was dried for 1 min at 125° C. The layer weight was 1.4 g/m².

The following were then sprayed on using a high-speed rotation bell with electrostatic assistance under the spraying conditions specified in Example 2 a) an aqueous dispersion of a zinc-ammonia complex salt of a methacrylic acid/styrene/ethyl acrylate copolymer having a particle size below 100 nm and b) as a comparison in accordance with EP-A 92 794, an aqueous solution of a polymer of styrene-4-sulfonic acid (sodium salt) having a molecular weight of 20,000. FK 20%.

various dome coverages being obtained by varying the coating speed (Table 3a).

Characteristic dispersion data:

Tg approximately 75° C., FK=20, anionic stabilizer in accordance with formula with $R^1=C_8H_{17}-$, $R^2=H$, n=3 and $Y=PO_3^{2-}$, nonionic stabilizer with $R^1=C_{16}H_{33}$, $R^2=H$, n=50, Y=H; acid content 0.53 mmol/g equivalent to 4.6% by weight of methacrylic acid.

TABLE 3a

| Example | Top layer | D | Dm | H | Hm | n |
|---|---|---|---|---|---|---|
| 3-1 | a | <20 | <80 | 3 | <10 | approx. 30 |
| 3-2 | a | <20 | <80 | 3 | <10 | approx. 100 |
| 3-3 | a | <20 | <80 | 3 | <10 | approx. 500 |
| 3-4 | a | <20 | <80 | 3 | <10 | approx. 1000 |
| 3-5 | a | <20 | <80 | 3 | <10 | approx. 9000 |
| 3-6 | a | <20 | <80 | 3 | <10 | approx. 25,000 |
| 3-1 | b* | <20 | <80 | 3 | <10 | approx. 30 |
| 3-2 | b* | <20 | <80 | 3 | <10 | approx. 100 |
| 3-3 | b* | <20 | <80 | 3 | <10 | approx. 500 |
| 3-4 | b* | <20 | <80 | 3 | <10 | approx. 1000 |
| 3-5 | b* | <20 | <80 | 3 | <10 | approx. 9000 |
| 3-6 | b* | <20 | <80 | 3 | <10 | approx. 25,000 |

The plates were contacted by a negative master in a vacuum-operated contact copying frame by evacuation and exposed using a 5 kW metal-halide mercury-vapor lamp at a distance of 110 cm for 25 s and then developed in an immersion-bath development unit with a brush at a processing rate of 0.6 m/min in the developer solution having the following composition:

1 pbw of nitrilotrismethylphosphonic acid, 1 pbw of potassium metalsilicate ($K_2O:SiO_2=1:3$), 1 pbw of NaOH, 1 pbw of phenoxypropanol and 0.1 pbw of sec-alkanesulfonate, 0.1 pbw of fatty alcohol polyoxyethylene ether in 95.8 pbw of water The results are shown in Table 3b.

TABLE 3b

| Example | Top layer | T | K | S | R | A | V |
|---|---|---|---|---|---|---|---|
| 3-1 | a | <20 | + | + | 0 | + | + |
| 3-2 | a | <20 | + | + | + | + | + |
| 3-3 | a | <20 | + | + | + | + | + |
| 3-4 | a | <20 | + | + | + | + | + |
| 3-5 | a | <20 | + | + | + | + | + |
| 3-6 | a | <20 | + | + | + | + | + |
| 3-1 | b* | <20 | – | + | 0 | + | – |
| 3-2 | b* | <20 | – | + | 0 | + | – |
| 3-3 | b* | <20 | – | + | + | + | – |
| 3-4 | b* | <20 | – | + | + | + | – |
| 3-5 | b* | <20 | – | + | + | + | – |
| 3-6 | b* | <20 | – | + | + | + | – |

EXAMPLE 4

A 0.4 mm thick aluminum foil was first grained mechanically in a pumice powder suspension and then electrolytically in hydrochloric acid ($R_z$ value according to DIN 4768: 6.0 μm), then subjected to an intermediate pickling in sulfuric acid and anodized (oxide weight 4.0 g/m$^2$), hydrophilized with polyvinylphosphonic acid and coated with the following solution:

1.8 pbw of a copolymer of methacrylic acid, methyl methacrylate and 2-hydroxyethyl methacrylate (20:30:50) having a molecular weight of 20,000, 0.5 pbw of the diazonium salt polycondensation product specified in Example 1, 0.09 pbw of Victoria pure blue FGA and 0.07 pbw of phosphoric acid (85%-strength) in 60 pbw of 2-methoxyethanol and 20 pbw of butyl acetate.

The layer was dried for 1 minute at 125° C. The layer weight was 1.5 g/m$^2$.

Aqueous dispersions of the following polymer were then sprayed on using a high-speed rotation bell with electrostatic assistance:

EXAMPLE 4-1

Copolymer of 80% vinylidene chloride, 5% acrylonitrile, 12% methyl methacrylate and 3% acrylic acid (equivalent to 0.42 mmol/g); stabilizer: dodecyl benzenesulfonate, FK=20

EXAMPLE 4-2

Copolymer of styrene, butyl acrylate and sodium methenesulfonate having a sulfonate content of 0.43 mmol/g; no additional stabilizer, FK=20

EXAMPLE 4-3

Copolymer as in 4-2; stabilizer: hydroxyethylcellulose, 10%-based on FK=18, and also as a comparison corresponding to EP-A 174 588 (4—4*), the radiation-sensitive coating solution.

Spraying conditions:
Spraying bell-substrate distance 15 cm,
Bell speed 30,000 rpm, bell diameter 6 cm,
Potential difference 35 kV, IR drying.

Under these circumstances, the following dome coverage was obtained: (values from image analysis) D=25–35, Dm=40–50, H=3–4, Hm=8–10, n=1500–2500.

The plates were exposed in a vacuum-operated copying frame using a metal-halide-doped 5 kW mercury-vapor lamp at a distance of 110 cm for 35 s. Development was carried out in an immersion-bath development unit with a brush at a processing rate of 0.8 m/min in the developer from Example 1.

The results reproduced in Table 4 were obtained.

TABLE 4

| Example | T | K | S | R | A | V |
|---|---|---|---|---|---|---|
| 4-1 | <20 | + | + | + | + | + |
| 4-2 | <20 | + | + | + | + | + |
| 4-3 | <20 | + | + | + | + | + |
| 4-4* | <20 | + | + | + | – | + |

We claim:

1. A photosensitive recording material comprising
   a layer base,
   a negative-working photosensitive layer comprising an admixture of a diazonium salt in amount sufficient to render the layer photosensitive and a water-insoluble polymeric binder which is soluble or swellable in aqueous alkaline solutions in an amount sufficient to form a layer, and
   a discontinuous top layer which forms a rough surface, wherein the top layer is comprised of particles of a water-insoluble polymer which is dispersible in water in the presence of anionic or anionic/nonionic dispersants and which has a content of free acid groups or acid groups neutralized by salt formation of less than 0.8 mmol/g, the mean height of the particles being 2 to 6 μm, the maximum height less than 10 μm, the mean horizontal diameter less than 40 μm, the maximum diameter less than 80 μm and the number of particles being 100 to 10,000 per cm$^2$,
   wherein the material is such that upon exposure and development with an aqueous-alkaline developer, the discontinuous top layer remains intact at imaged areas of the photosensitive layer.

2. The photosensitive recording material as claimed in claim 1, wherein the water-insoluble polymer of the top layer contains acid groups which are carboxylic acid, sulfonic acid, or phosphonic acid groups.

3. The photosensitive recording material as claimed in claim 1, wherein the water-insoluble polymer of the top layer has an acid group content of 0.01 to 0.75 mmol/g.

4. The photosensitive recording material as claimed in claim 1, wherein the water-insoluble polymer of the top layer is a polyester, polyamide, polyurethane, polyurea, or a copolymer containing units of one or more of acrylic acid, methacrylic acid, itaconic acid, maleic acid, vinylsulfonic acid or styrenesulfonic acid.

5. The photosensitive recording material as claimed in claim 1, wherein the diazonium salt is a polycondensation product.

6. The photosensitive material as claimed in claim 1, wherein the particles have a diameter less than 20 μm.

7. The photosensitive material as claimed in claim 1, wherein the proportion of diazonium compound in the photosensitive layer is 5–90% by weight and polymeric binder is 10–95% by weight, based on the total weight of the non-volatile constitutents comprising the photosensitive layer.

8. The photosensitive material as claimed in claim 1, wherein the particles of the top layer are flattened hemispheres or hemiellipsoids.

9. The photosensitive material as claimed in claim 1, wherein the water-insoluble polymer of the top layer contains a total amount of acid groups and neutralized acid groups of 0.01 to less than 0.8 mmol/g.

10. The photosensitive material as claimed in claim 9, wherein at least a part of the acid groups of the water-insoluble polymer of the top layer are neutralized.

11. The photosensitive material as claimed in claim 1, wherein the water-insoluble polymer of the top layer does not contain acid groups or neutralized acids groups, and is stabilized with one or more anionic surfactants.

12. The photosensitive material as claimed in claim 1, wherein the dispersion is stabilized by an anionic surfactant compound of the formula $$R^1O-(CH_2-CHR^2-O-)_nY$$

wherein $R^1$ is a $(C_6-C_{20})$alkyl radical or an optionally $(C_1-C_{18})$ alkyl-substituted $(C_6-C_{12})$aryl radical, $R^2$ is a hydrogen atom or a methyl group, Y is an $SO_3^-$, $CH_2-CO_2^-$ or $PO_3^{2-}$ group and n is an integer from 0 to 50 and the associated cation is a sodium, potassium, ammonium, diethanolammonium, or triethanolammonium ion.

13. A photosensitive recording material comprising a layer base, a negative-working photosensitive layer comprising an admixture of a diazonium salt in amount sufficient to render the layer photosensitive and a water-insoluble polymeric binder which is soluble or swellable in aqueous alkaline solutions in an amount sufficient to form a layer, and a discontinuous top layer which forms a rough surface, wherein the top layer is comprised of particles of a water-insoluble polymer which have a content of free acid groups or acid groups neutralized by salt formation of from 0.01 to less than 0.8 mmol/g, the mean height of the particles being 2 to 6 μm, the maximum height less than 10 μm, the mean horizontal diameter less than 40 μm, the maximum diameter less than 80 μm and the number of particles being 100 to 10,000 per cm².

wherein the material is such that upon exposure and development with an aqueous-alkaline developer, the discontinuous top layer remains intact at imaged areas of the photosensitive layer.

14. A process for the production of a photosensitive recording material as claimed in claim 1, which comprises spraying an anionically or anionically/nonanionically stabilized aqueous dispersion of the water-insoluble polymer having a content of free acid groups or acid groups neutralized by salt formation of less than 0.8 mmol/g onto the negative-working photosensitive layer and drying it.

15. The process as claimed in claim 14, wherein the dispersion is sprayed on with electrostatic assistance.

16. The process as claimed in claim 14, wherein the dispersion is stabilized by an anionic surfactant compound of the formula $$R^1O-(CH_2-CHR^2-O-)_nY$$

wherein $R^1$ is a $(C_6-C_{20})$alkyl radical or an optionally $(C_1-C_{18})$ alkyl-substituted $(C_6-C_{12})$aryl radical, $R^2$ is a hydrogen atom or a methyl group, Y is an $SO_3^-$, $CH_2-CO_2^-$ or $PO_3^{2-}$ group and n is an integer from 0 to 50 and the associated cation is a sodium, potassium, ammonium, diethanolammonium, or triethanolammonium ion.

17. The process as claimed in claim 14, wherein the dispersion comprises 5 to 50% by weight of nonvolatile constituents, which remain on the surface of the photosensitive layer after drying.

18. The process as claimed in claim 14, wherein the dispersion comprises a nonionic surfactant or protective colloid.

19. A method for producing a printing form, comprising imagewise exposing the photosensitive material of claim 1, and developing the exposed material.

20. A process for the production of a photosensitive recording material as claimed in claim 9, which comprises spraying an aqueous dispersion of the water-insoluble polymer of the top layer onto the negative-working photosensitive layer and drying it.

* * * * *